(12) United States Patent
Dodd et al.

(10) Patent No.: US 10,159,150 B2
(45) Date of Patent: Dec. 18, 2018

(54) CERAMIC BOARD WITH MEMORY FORMED IN THE CERAMIC

(71) Applicants: STMICROELECTRONICS, INC., Coppell, TX (US); STMICROELECTRONICS S.R.L., Agrate Brianza (IT)

(72) Inventors: Simon Dodd, West Linn, OR (US); Roberto Brioschi, Sesto San Giovanni (IT)

(73) Assignees: STMICROELECTRONICS, INC., Coppell, TX (US); STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/253,615

(22) Filed: Aug. 31, 2016

(65) Prior Publication Data
US 2017/0311446 A1 Oct. 26, 2017

Related U.S. Application Data

(60) Provisional application No. 62/325,368, filed on Apr. 20, 2016.

(51) Int. Cl.
*H05K 1/18* (2006.01)
*H05K 1/11* (2006.01)
*H05K 1/03* (2006.01)
*H05K 3/40* (2006.01)
*H05K 3/10* (2006.01)

(52) U.S. Cl.
CPC .......... *H05K 1/181* (2013.01); *H05K 1/0306* (2013.01); *H05K 1/111* (2013.01); *H05K 3/10* (2013.01); *H05K 3/4007* (2013.01); *H05K 2201/10083* (2013.01); *H05K 2201/10159* (2013.01); *H05K 2201/10181* (2013.01)

(58) Field of Classification Search
CPC ...... H05K 1/111; H05K 1/181; H05K 3/4007; H05K 3/4046; H05K 3/4084
See application file for complete search history.

(56) References Cited

U.S. PATENT DOCUMENTS

| | | | |
|---|---|---|---|
| 4,413,272 A * | 11/1983 | Mochizuki | G11C 17/16 257/529 |
| 6,946,718 B2 | 9/2005 | Chavarria | |
| 2011/0032642 A1* | 2/2011 | Kautzky | G11B 5/4826 360/246.2 |

* cited by examiner

*Primary Examiner* — Hoa C Nguyen
(74) *Attorney, Agent, or Firm* — Seed IP Law Group LLP (57) ABSTRACT

The present disclosure is directed to a ceramic substrate that includes a plurality of contact pads, a plurality of electrical traces, and a microelectromechanical die. Contacts on the die are coupled to the plurality of contact pads through the plurality of electrical traces. The substrate also includes a plurality of memory bits formed directly on the substrate. Each memory bit is coupled between a first one of the contact pads and a second one of the contact pads.

16 Claims, 6 Drawing Sheets

CERAMIC BOARD WITH MEMORY FORMED IN THE CERAMIC

BACKGROUND

Technical Field

The present disclosure is directed to a substrate that supports a chip including a microelectromechanical system where the substrate includes memory integrated within the substrate.

Description of the Related Art

In order to simplify manufacturing and keep costs down, many microelectromechanical die are passive, in that they only include passive circuitry. These die do not include active circuitry, like transistors or memory. If memory is needed for such die, the options are to include memory into the microelectromechanical die or add a separate die for memory on a support substrate. Both options make the overall product much more expensive.

BRIEF SUMMARY

The present disclosure is directed to a ceramic substrate or support for a microfluidic die or a microelectromechanical die where the ceramic substrate includes one-time programmable memory formed directly into the substrate. The one time programmable memory is formed on a surface of the substrate and is coupled to contact pads on the surface of the substrate. These contact pads are coupled to external devices and provide signals to and from the die attached to the substrate. The contact pads may have a dual purpose in that the contact pad can program or read the memory during one mode of operation and can receive a drive signal in another mode of operation. Each memory bit is coupled between two contact pads. Multiple memory bits can share a common ground such that a first number of memory bits m will use a total of m+1 contact pads for reading and writing these memory bits.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

The present disclosure is directed to integrating a memory within a support substrate in an otherwise passive device; for example, a substrate that supports a die having a microelectromechanical system (MEMS), such as a gyroscope or a microfluidic die. The die having the MEMS may be a passive device in that there are no active components or active circuitry on the die. The die is configured to receive a signal from an external, distinct application specific integrated circuit (ASIC), such that the die only includes electrical traces and other passive components, with no transistors. In other embodiments, the die may have active components as the specific use of the die may dictate.

Typical integrated circuits (ICs) and ASICs often have sophisticated memory structures formed within the die. The ICs are packaged in a way that the memory of the IC can be read externally. Sometimes circuits or MEMS devices are packaged on substrates (such as a printed circuit board (PCB) or a ceramic board) without the combination of a "real" IC. Without the IC, most MEMS structures do not have the ability to encode memory bits and the substrates themselves usually include only traces and passive components. This present disclosure allows a packaged MEMS (the MEMS die on a substrate) to have a very small amount of memory without the use of an extra IC.

Figure 1:
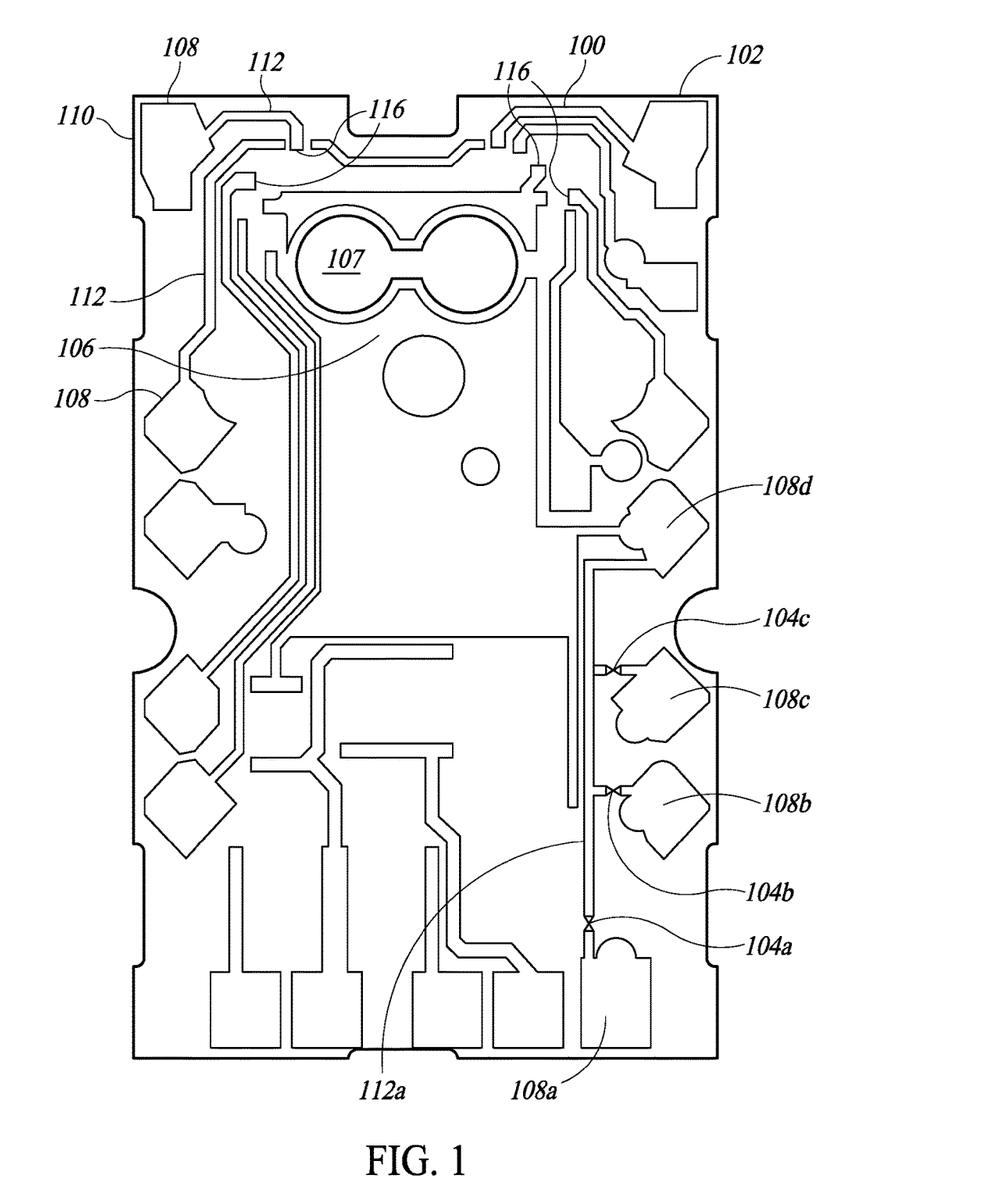
FIG. 1 is a ceramic substrate including memory.

As represented in FIG. 1, the present disclosure utilizes electronic 100 traces on a PCB or ceramic substrate 102 and modifies or integrates with them to create a static or fusible memory 104. There are no active components on the substrate 102 and the substrate 102 is configured to support a passive die, which will be positioned over a die support region 106. This particular substrate includes an opening 107 which is to be aligned with a fluid path in the die (not shown). The die includes a MEMS device, such as one that is configured to eject a fluid, such as an insulin pump, an inkjet print head, a fragrance distribution device, or other fluid ejection devices. More specifically, the MEMS may be a microfluidic die.

In one embodiment, the die is a MEMS based insulin pump. The pump contains passive pressure sensors that can be somewhat inaccurate based on manufacturing tolerances. In order to increase the yield of these MEMS devices, adding memory to the support substrate allows for calibration to adjust for the manufacturing tolerance. For example, the MEMS device will function better if the passive sensors are measured before use and then binned into ranges that correlate to known pressures. In essence, a gross calibration is performed. Without memory this calibration cannot be transferred to the larger device. Including the memory on the substrate keeps manufacturing of the MEMS device simple and cost effective and allows for simple programming of the calibration data on the support substrate. By adding just a few bits of memory to the substrate, there is no additional material cost and the device could read the programmed memory to better utilize the pressure sensor.

The substrate 102 includes a plurality of contact pads 108, each formed adjacent to a periphery 110 of the substrate 102. Electrical traces 112 extend from the contact pads 108 into the die support region 106 of the substrate. The contacts and electrical traces may be silver palladium or silver platinum, which have a higher resistance than gold. The contact pads are an external interface to the world. They provide signals to and from the MEMS die, such as drive signals.

The board may include wire bonding pads that align with ends 116 of the electrical traces 112 to provide a coupling location for wires from the MEMS device. The location and arrangement of the electrical traces 112 are selected to provide a short distance from a contact formed at an edge of the die to the end 116. The particular size, shape, and arrangement will change based on the selected die and the size and shape of the support substrate.

The memory bits 104 are integrated into the existing configurations of the contact pads 108a-108c and the electrical traces. In this example in FIG. 1, the lower right-hand portion of this substrate includes the memory bits 104 in an area that was previously free from other components. The memory can be integrated at any location on the substrate where there is room to form these memory structures between other components.

Each memory bit, such as memory bits 104a-104c, is coupled between two contact pads 108a and 108d. One contact pad provides the power and the other is grounded. The memory bits 104 are one-time programmable bits, shown in this Figure as a bowtie structure fuse that, once a voltage applied to one of the contacts is high enough, will blow or otherwise be programmed. For example, a blown fuse may represent a zero and an intact fuse may represent a one. As shown with contact pad 108d, the contact pad may be used in conjunction with the memory bit and for another purpose unrelated to the memory. This minimizes the number of contacts that are to be included with this substrate.

In FIG. 1, each of the memory bits are coupled between one electrical trace 112a, which is coupled to the contact pad 108d. There may be more than one electrical trace coupled to a larger number of the memory bits. For example, there could be a second group of memory bits coupled to a different electrical trace from the electrical trace 112a.

The support substrate includes various layers that are formed using a masking pattern, which covers portions of the substrate with a protective glaze. The contact pads are not covered.

Figure 2A:
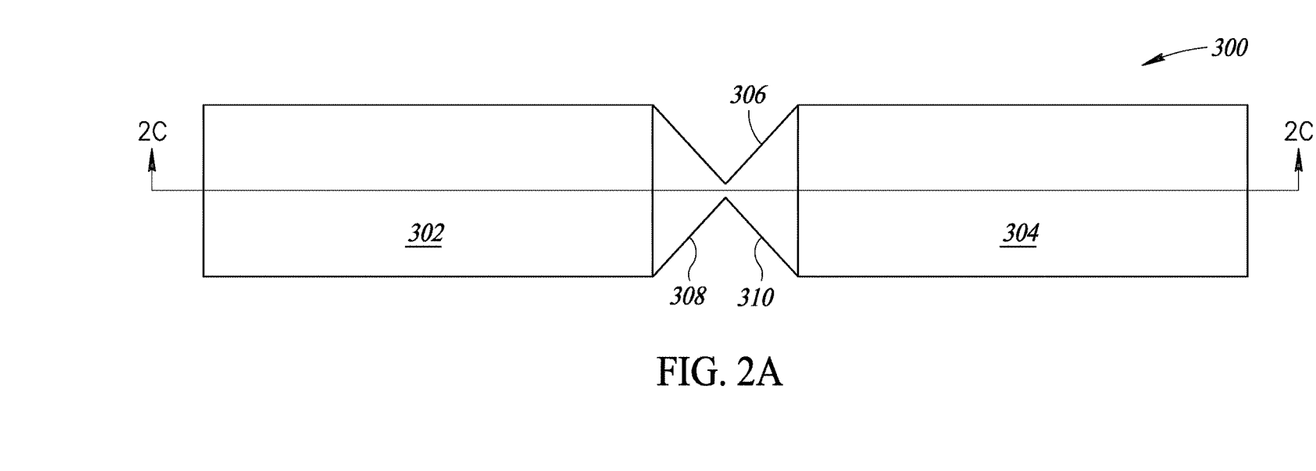
FIGS. 2A-2C are views of a fusible memory formed on the substrate of FIG. 1.
Figure 2B:
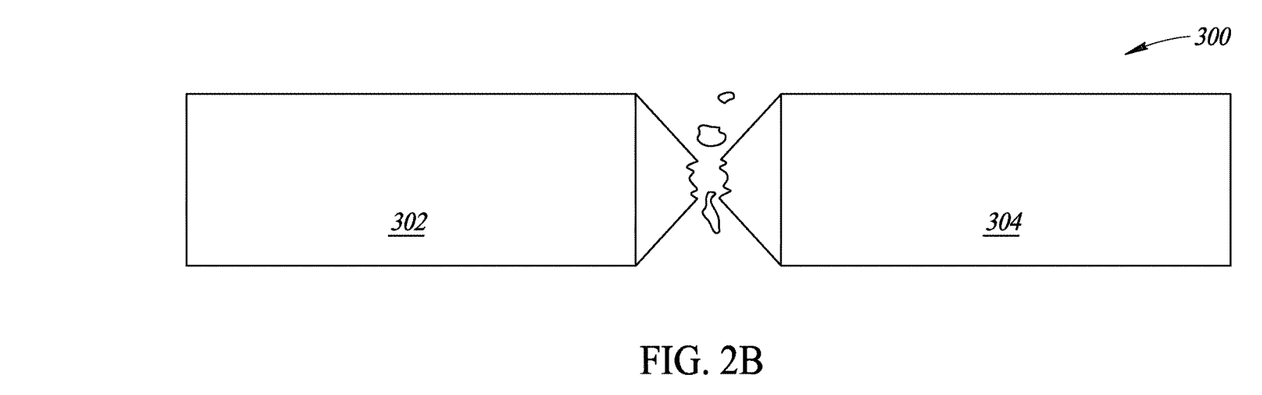
Figure 2C:
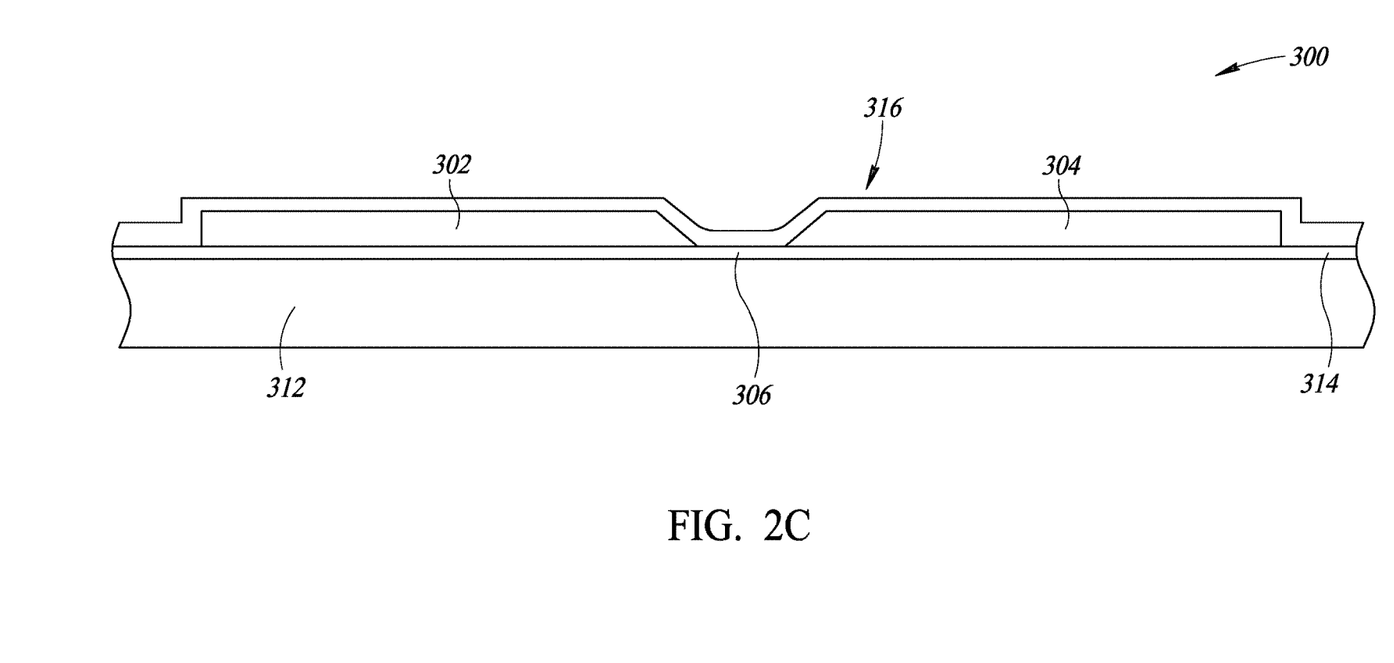

FIGS. 2A-2C include an example of a fusible memory 300 that can be formed in a memory 104 of the substrate 102 of FIG. 1. The memory 300 includes a first high conductivity portion 302 and a second high conductivity portion 304. The first and second portions can be formed from a metal layer, such as gold or copper. In other embodiments, the first and second portions may be polysilicon. The resistance may be 0.1 ohms/square. In this embodiment, the first and second portions are rectangular.

Between the rectangular portions is a narrow region that forms a high resistance region 306. In FIGS. 2A and 2B, the narrow region 306 is formed in the shape of two triangles 308, 310 with points that overlap in a center of a "bowtie" shaped structure (the "bowtie" including the first and second portions and the triangular regions). This narrow region may be formed by laser trimming. This narrow portion causes a high resistance that when provided with enough current, can "blow" or otherwise destroy the connection between the first and second portions. For example, the high resistance portion may have 50-100 ohms/square.

The "bowtie" structure, when undamaged or not blown, may represent one bit, such as a zero. The undamaged structure is a short. The damaged or blown bowtie structure represents a bit, such as a one, i.e., it is open.

The memory 300 can be formed at the same time as the contact pads and electrical traces. The memory can be any number of shapes that allow for current crowding, so that the "fuse" can be blown with a high enough current. The fuse memory can be formed of the same materials as the contact pads and traces, such as by silver platinum or sliver palladium. It may also be gold.

FIG. 2C is a cross-sectional view of the memory bit 300 of FIGS. 2A, 2B. A ceramic substrate 312 is the support. A layer 314 of the high resistance material is formed on the substrate 312. A portion of the high resistance material 314 forms the high resistance region 306, which acts as the fuse portion of the memory bit. This layer 314 is shown as extending to ends of the support; however, the layer can be more precisely formed to be positioned directly under the first and second low resistance portions 302, 304. A protective, dielectric layer 316 can be formed on top of the first and second low resistance portions 302, 304. These first and second low resistance portions are coupled to contact pads in views not shown.

The shape of the memory will allow for the creation, during testing or calibration, of an open or a short, either a one or a zero. This allows the manufacturer to bin and program the substrate and MEMS package without having an active chip or other active memory on the substrate or in the MEMS die. More particularly, there are no transistors in the whole assembly. A microcontroller will be provided on a separate, distinct board. The board may include other sensors or passive components, such as a wheat-stone bridge.

During calibration a measurement of the pressure output during a dry state for microfluidic die, such as an insulin pump, is performed. This includes moving a piezo-resistive element within the microfluidic die and testing the output. The memory on the board can be programmed with a specific calibration that identifies how to best utilize the microfluidic die. In the embodiment that includes a wheatstone bridge on the substrate, the wheat-stone bridge measures the outputted pressure and compares it to a look up table that provides guidance as to offset. The offset is then programmed into the memory. This can be achieved with three bits of memory. During operation, the remote microcontroller can read the memory to determine the offset and then calibrate how to drive the microfluidic die efficiently.

The memory can be coupled to existing pads already provided in the substrate such that the substrate may not need to add more contact pads than those needed for the microfluidic die's operation. In this embodiment, the memory is formed between contact pads or traces that are otherwise not related to each other; for example, contact pads that are not used to control similar or adjacent aspects of the die.

In other embodiments, a number of bits n will use a number of extra pads that is n+1. The n+1 pads will be in addition to the standard pads used for the microfluidic die.

Figure 3:
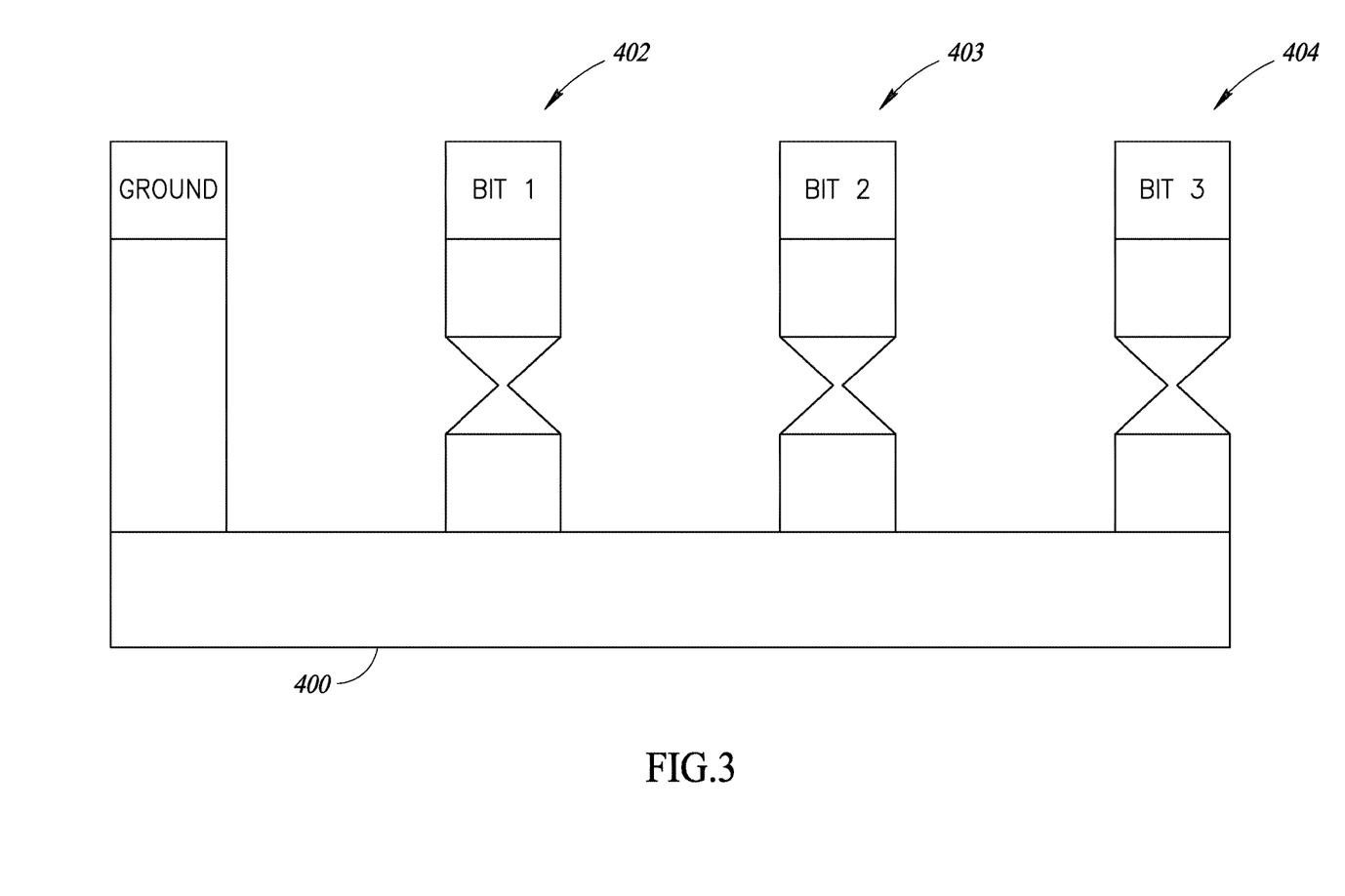
FIG. 3 is an example of a fusible memory formed on the substrate according to another embodiment of the present disclosure.

In other embodiments, the memory can share a common ground such that a number of bits n will equal a number of extra contact pads n. For example, in FIG. 3, common ground 400 is shared between three bits of memory 402, 403, 404. The common ground 400 is the common ground already provided on the substrate. Each bit of memory 402, 403, 404 will have its own contact pad. To program the bit, a large current will be provided to blow the high resistance region, such as to represent a 1.

The memory may correspond to a number of additional pads that can be added to the substrate while utilizing a common ground. If the substrate has 20 pads (including at least one ground) then 20 additional pads allows for 20 memory bits to be added to the substrate. Traces between the pads and the ground can be "hard coded" by use of photolithography, printing, or laser to connect or "open" traces. If a more dynamic structure is needed to program bits after the substrate creation, fusible links can be created through high resistance bowtie-shaped structures. These structures can be low resistance when connected (100 ohms or less) and, after a short high current pulse is placed across the traces, the structures become high resistance (5000 ohms or more). A bowtie can be provided with around a 10 um neck and a 50-100 ohm resistance, such that the narrow portion can be blown with an appropriate application of current.

Figure 4A:
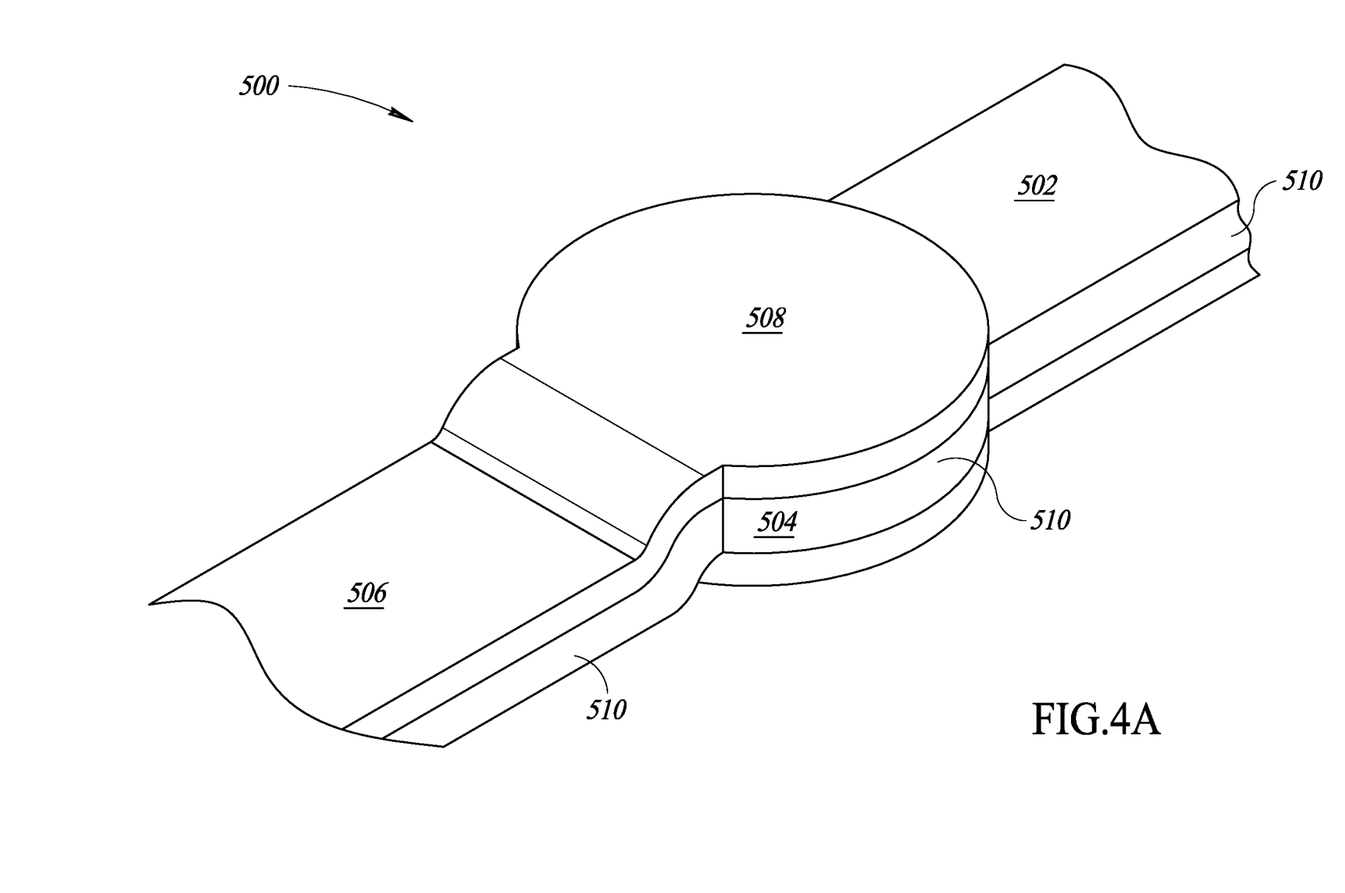
FIGS. 4A-4C are views of an alternative implementation of a fusible memory formed on the substrate.
Figure 4B:
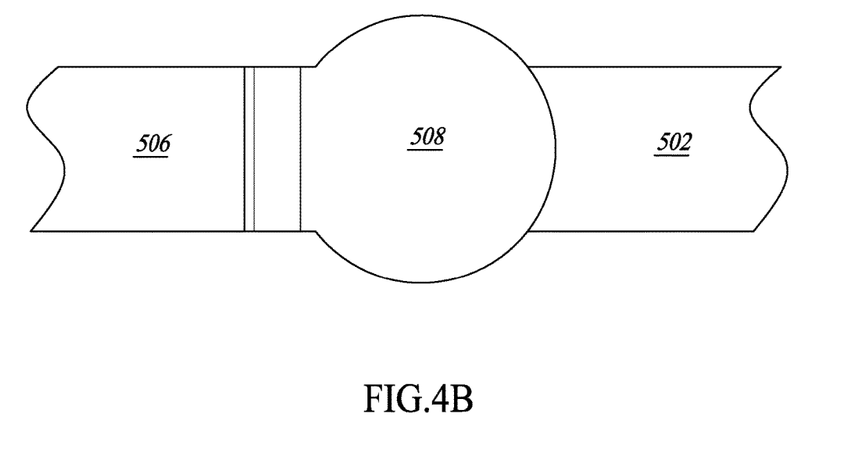
Figure 4C:
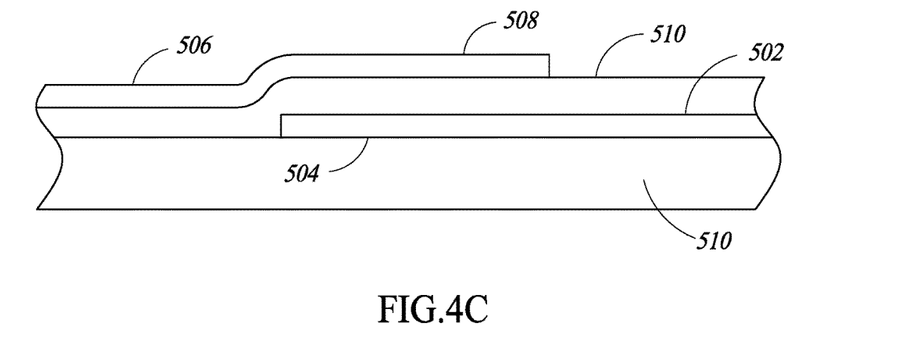

FIGS. 4A-4C are views of an alternative shape of a memory 500 that includes a first conductive strip 502 with a first circular end 504 and a second conductive strip 506 with a second circular end 508. FIG. 4A is a perspective view. FIG. 4B is a top view and FIG. 4C is a cross-sectional view. The first conductive strip 504 is positioned on the ceramic substrate 510. The first conductive strip is positioned between the second conductive strip and the substrate. The first and second strips, including the first and second circular ends, are separated by a high resistance layer 510, which may be a dielectric, polysilicon, tantalum, tantalum aluminum, or another suitable layer. The first and second conductive strips are highly conductive, such as gold or silicon carbide, which have a low resistance. The dielectric layer may be silicon nitride. When a significant enough current is applied through the memory 500, dielectric will break down electrically connecting the first circular end 506 with a second circular end 508. The state may be changed such that the memory will change from a one to a zero or vice versa. These memories are one-time programmable.

The first and second circular ends could be rectangular or another suitable shape. These ends have a wider surface area than the first and second conductive strips 506 and 502 so that more energy is concentrated over the memory region, so that when sufficient energy is applied through the ends, the memory region is programmed.

A device of the present disclosure includes a passive microelectromechanical die; a substrate that includes: a die support region that supports the microelectromechanical die; a plurality of contact pads; a plurality of electrical traces, a number of the plurality of electrical traces coupled to the plurality contact pads, and a number of the plurality of electrical traces coupled to the microelectromechanical die; and a memory formed on the substrate.

The memory is a fusible memory that is coupled to ones of the plurality of contact pads. The memory has a bowtie shape. The memory includes: a first conductive region; a second conductive region; and an intermediate region positioned between the first and second conductive regions. The first and second regions are formed on a same layer. The first conductive region is formed on a dielectric layer above the second conductive region. The first conductive region includes a first circular end and the second conductive region includes a second circular end, the first circular end aligned with the second circular end.

The present disclosure solves the problem of having no of memory associated with a microelectromechanical die on a substrate. Creating a small amount of memory can be helpful to improve performance. For example, during testing by the original manufacturer the manufacturer can store information in a small number of memory bits regarding parameters of the particular microelectromechanical die. These may be parameters that are stored in a look up table provided to the customer such that the memory bits can represent a row in the look up table. As such, only a small number of memory bits will be included on the substrate. This avoids having to create a very complex microelectromechanical die that includes active circuitry. This also avoids having to include a second, separate die on the substrate.

The memory bits described in this disclosure are formed on or in the substrate and are coupled to contact pads on the substrate. These contact pads can be dual purpose in that these contact pads may have two modes of operation. A first mode of operation may be directed to driving, reading, or otherwise interacting with the microelectromechanical die. For example, if the microelectromechanical die is a microfluidic die, then the contact pad in the first mode may receive a drive signal to eject fluid from one or more nozzles. A second mode of operation for the contact pads will be reading or programming the memory bit coupled to the contact pads.

A device of the present disclosure includes a ceramic substrate; a plurality of contact pads formed on the ceramic substrate; a plurality of electrical traces formed on the ceramic substrate; and a plurality of memory bits formed on the ceramic substrate. The plurality of memory bits are coupled between ones of the plurality of contact pads. Each memory bit includes a first conductive region and a second conductive region. The first conductive region is rectangular and the second conductive region is rectangular. Each memory bit includes a third conductive region that is narrower than the first and second conductive regions.

A method includes forming a plurality of contact pads on a ceramic substrate; forming a plurality of electrical traces on the ceramic substrate; and forming a plurality of memory bits formed on the ceramic substrate. The method further includes coupling the plurality of memory bits between ones of the plurality of contact pads. The method includes forming the plurality of memory bits includes forming a first conductive region above a second conductive region. The method includes forming the plurality of memory bits includes forming a plurality of bowtie memory bit structures.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a passive microelectromechanical die;
   a substrate that includes:
      a die support region that supports the microelectromechanical die;
      a first group of contact pads and a second group of contact pads;
      a first plurality of electrical traces, coupled between the first group of contact pads and the passive microelectromechanical die;
      a second plurality of electrical traces; and
      a memory formed on the substrate including:
         a plurality of bits, each bit coupled between one of the second plurality of electrical traces and a contact pad of the second group of contact pads.

2. The device of claim 1 wherein the memory is a fusible memory.

3. The device of claim 2 wherein each bit of the plurality of bits of the memory formed on the substrate has a bowtie shape.

4. The device of claim 1 wherein each bit of the plurality of bits of the memory formed on the substrate includes:
   a first conductive region;
   a second conductive region; and
   an intermediate region positioned between the first and second conductive regions.

5. The device of claim 4 wherein the first and second conductive regions are formed on a same layer.

6. The device of claim 4 wherein the first conductive region is formed on a dielectric layer above the second conductive region.

7. The device of claim 6 wherein the first conductive region includes a first circular end and the second conductive region includes a second circular end, the first circular end aligned with the second circular end.

8. A device, comprising:
   a ceramic substrate;
   a plurality of contact pads formed on the ceramic substrate;
   a plurality of electrical traces formed on the ceramic substrate; and
   a plurality of memory bits formed on the ceramic substrate, each bit of the plurality of memory bits coupled between one electrical trace of the plurality of electrical traces and one contact pad of the plurality of contact pads.

9. The device of claim 8 wherein the plurality of memory bits are coupled between one of a first group of the plurality of contact pads and one of a second group of the plurality of contact pads.

10. The device of claim 8 wherein each memory bit includes a first conductive region and a second conductive region.

11. The device of claim 10 wherein the first conductive region is rectangular and the second conductive region is rectangular.

12. The device of claim 11 wherein each memory bit includes a third conductive region that is narrower than the first and second conductive regions.

13. A method, comprising:
   forming a plurality of contact pads on a ceramic substrate;
   forming a plurality of electrical traces on the ceramic substrate;
   forming a plurality of memory bits formed on the ceramic substrate;
   coupling a microelectromechanical die to the ceramic substrate; and
   coupling the plurality of memory bits to the microelectromechanical die through ones of the plurality of contact pads and ones of the plurality of electrical traces.

14. The method of claim 13, further comprising coupling the plurality of memory bits between ones of the plurality of contact pads.

15. The method of claim 13 wherein forming the plurality of memory bits includes forming a first conductive region above a second conductive region.

16. The method of claim 13 wherein forming the plurality of memory bits includes forming a plurality of bowtie memory bit structures.

* * * * *